US008786377B2

(12) United States Patent
Houston et al.

(10) Patent No.: US 8,786,377 B2
(45) Date of Patent: Jul. 22, 2014

(54) SYSTEM AND METHOD OF MAINTAINING GAIN LINEARITY OF VARIABLE FREQUENCY MODULATOR

(75) Inventors: M. Jason Houston, Cary, NC (US); Steven P. Laur, Raleigh, NC (US); Rhys S. A. Philbrick, Cary, NC (US)

(73) Assignee: Intersil Americas LLC, Milpitas, CA (US)

( * ) Notice: Subject to any disclaimer, the term of this patent is extended or adjusted under 35 U.S.C. 154(b) by 186 days.

(21) Appl. No.: 13/537,708

(22) Filed: Jun. 29, 2012

(65) Prior Publication Data
US 2013/0127557 A1 May 23, 2013

Related U.S. Application Data

(60) Provisional application No. 61/562,028, filed on Nov. 21, 2011.

(51) Int. Cl.
| H03K 7/08 | (2006.01) |
| H03K 7/06 | (2006.01) |
| H03K 7/10 | (2006.01) |
| H03K 3/0231 | (2006.01) |
| H02M 3/156 | (2006.01) |

(52) U.S. Cl.
CPC .. *H03K 7/08* (2013.01); *H03K 7/06* (2013.01); *H03K 7/10* (2013.01); *H03K 3/0231* (2013.01); *H02M 3/1563* (2013.01)
USPC ........... 332/109; 332/112; 331/143; 323/282; 323/288

(58) Field of Classification Search
CPC ............. H03K 7/06; H03K 7/08; H03K 7/10; H03K 3/0231; H03K 3/023; H03K 4/08; H02M 3/156; H02M 3/1563; H02M 3/158; H02M 3/1582; H02M 3/155
USPC .......... 332/109, 110, 112, 106; 331/111, 143; 323/282, 288, 290, 284
See application file for complete search history.

(56) References Cited

U.S. PATENT DOCUMENTS

| 7,106,130 B2 * | 9/2006 | Gan et al. ........................ 330/10 |
| 7,471,133 B1 * | 12/2008 | Moussaoui et al. ........... 327/172 |
| 7,719,251 B2 * | 5/2010 | Qahouq et al. ................ 323/286 |

* cited by examiner

*Primary Examiner* — Ryan Johnson
(74) *Attorney, Agent, or Firm* — Gary Stanford

(57) ABSTRACT

A variable frequency modulator including a compensation network, first and second pulse control networks and a linearity controller. The compensation network is configured to provide a compensation signal indicative of an output load condition. The first pulse control network is configured to initiate pulses on a pulse control signal and to adjust operating frequency based on changes of the compensation signal. The second pulse control network is configured to terminate the pulses on the pulse control signal based on a predetermined timing parameter. The linearity controller is configured to adjust timing of terminating the pulses based on a predetermined steady state operating frequency and an actual operating frequency to maintain modulator gain at a constant level.

20 Claims, 5 Drawing Sheets

SYSTEM AND METHOD OF MAINTAINING GAIN LINEARITY OF VARIABLE FREQUENCY MODULATOR

CROSS-REFERENCE TO RELATED APPLICATIONS

This application claims the benefit of U.S. Provisional Application Ser. No. 61/562,028, filed on Nov. 21, 2011, which is hereby incorporated by reference in its entirety for all intents and purposes.

BRIEF DESCRIPTION OF THE DRAWINGS

The benefits, features, and advantages of the present invention will become better understood with regard to the following description, and accompanying drawings where.

DETAILED DESCRIPTION

The following description is presented to enable one of ordinary skill in the art to make and use the present invention as provided within the context of a particular application and its requirements. Various modifications to the preferred embodiment will, however, be apparent to one skilled in the art, and the general principles defined herein may be applied to other embodiments. Therefore, the present invention is not intended to be limited to the particular embodiments shown and described herein, but is to be accorded the widest scope consistent with the principles and novel features herein disclosed.

Variable frequency pulse width modulators are popular because they can provide fast dynamic response and high control loop bandwidths compared to fixed frequency pulse width modulators. Variable frequency operation, however, can cause non-linear modulator gain during common operating conditions. The non-linear modulator gain can contribute to several regulator design challenges, such as large overshoots, inconsistent dynamic response from small load to large load steps, inconsistent dynamic response during high frequency repetitive load transients, non-linear AC (alternating current) response, etc. The gain of conventional variable frequency modulators increases as the switching frequency increases which may cause large voltage "ringback" for larger load steps. The ringback is proportionally higher for larger load steps as compared to smaller load steps. The modulator may saturate at moderate load steps.

Conventional attempts to solve these problems included applying fixed multiples of ramp slew rates depending on phases overlapping or not overlapping. In many regulators, however, these conventional approaches have often made the problem worse. Some transient cycles resulted in significant phase overlap, whereas in other cycles there was no phase overlap. This resulted in a wide range of possible dynamic responses and very non-linear behavior. In a dual ramp system, for example, it has been determined that adjusting the up ramp signal based on phase overlap may lead to very non-linear behavior during high frequency repetitive load transient response, and the amount of phase overlap is inconsistent and may be different from load cycle to cycle.

A variable frequency modulator as described herein includes a linearity controller which compensates the gain to maintain gain linearity in response to changes in switching frequency. In this manner, the regulator design challenges described herein are eliminated or otherwise minimized.

Figure 1:
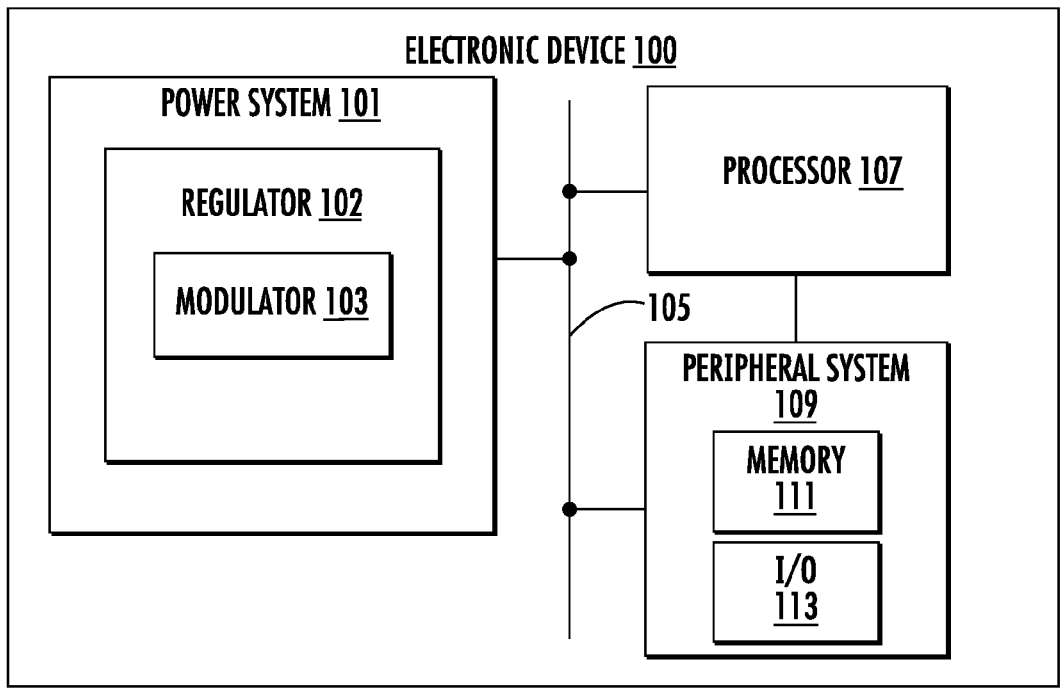
FIG. 1 is a simplified block diagram of an electronic device configured with a power system with a regulator, which further includes a modulator implemented according to an embodiment of the present invention.

FIG. 1 is a simplified block diagram of an electronic device 100 configured with a power system 101 with a regulator 102, which further includes a modulator 103 implemented according to an embodiment of the present invention. The power system 101 develops one or more supply voltages which provide power to other system devices of the electronic device 100. In the illustrated embodiment, the electronic device 100 includes a processor 107 and a peripheral system 109, both coupled to receive supply voltages from the power system 101 via a bus 105, which includes any combination of power and/or signal conductors. In the illustrated embodiment, the peripheral system 109 may include any combination of a system memory 111 (e.g., including any combination of RAM and ROM type devices and memory controllers and the like), and an input/output (I/O) system 113, which may include system controllers and the like, such as graphic controllers, interrupt controllers, keyboard and mouse controllers, system storage device controllers (e.g., controllers for hard disk drives and the like), etc. The illustrated system is exemplary only, since many of the processor system and support devices may be integrated onto the processor chip as understood by those skilled in the art.

The electronic device 100 may be any type of computer or computing device, such as a computer system (e.g., notebook computer, desktop computer, netbook computer, etc.), a media tablet device (e.g., iPad by Apple Inc., Kindle by Amazon.com, Inc., etc.), a communication device (e.g., cellular phone, smartphone, etc.), among other type of electronic devices (e.g., media player, recording device, etc.). The power system 101 may be configured to include a battery (rechargeable or non-rechargeable) and/or may be configured to operate with an alternating current (AC) adapter or the like.

Figure 2:
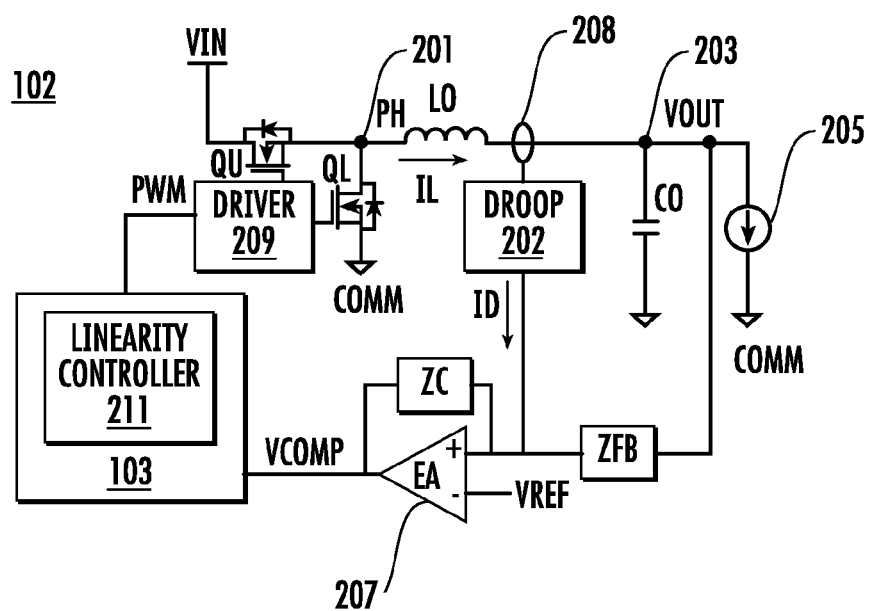
FIG. 2 is a simplified schematic and block diagram of the regulator including a simplified block diagram of the modulator of FIG. 1 including a linearity controller implemented according to one embodiment of the present invention.

FIG. 2 is a simplified schematic and block diagram of the regulator 102 including a simplified block diagram of the modulator 103 including a linearity controller 211 implemented according to one embodiment of the present invention. A pair of electronic switches QU (upper switch) and QL (lower switch) have their current terminals (e.g., drains and sources) coupled series between an input voltage VIN and a common reference voltage COMM (e.g., ground or any other suitable positive or negative reference voltage level). It is noted that COMM generally represents one or more reference nodes, including one or more ground levels or nodes, such as signal ground, power ground, chassis ground, etc., or any other suitable reference voltage level. The switches QU and QL are coupled together at an intermediate phase node 201 developing a phase voltage PH, and an output inductor LO has one end coupled to node 201 and its other end coupled to an output node 203 developing an output voltage VOUT. An output capacitor CO and a load 205 are coupled between output node 203 and COMM.

A first impedance ZFB is coupled between VOUT and an negative (−) input of an error amplifier (EA) 207 and a second impedance ZC is coupled between the inverting input and the output of the error amplifier 207. A reference voltage VREF is provided to the positive input of the error amplifier 207, which develops a compensation voltage VCOMP at its output provided to an input of the modulator 103. ZFB and ZC collectively form a compensation circuit, such as including resistors and capacitors and the like as understood by those of ordinary skill in the art. A current sensor 208 is shown sensing inductor current IL through the output inductor LO, which provides an inductor current signal or indication to a droop controller 202. Although a current sensor is depicted, an actual current sensor in not necessary since the inductor current IL may be sensed, simulated or otherwise synthesized to measure or estimate IL. The droop controller 202 provides a droop current ID to the node at the negative input of the error amplifier 207. Voltage droop is the intentional adjustment of the output voltage VOUT in response to the level of output load as understood by those of ordinary skill in the art. The modulator 103 develops a pulse control signal PMW (pulse-width modulation) to an input of a driver module 209, which drives the control inputs (e.g., gate terminals) of the switches QU and QL according to PWM control based on the PWM signal.

Conventional modulators may have non-linear modulator gain which can contribute to several regulator design challenges as previously described. The linearity controller 211 linearizes the gain of the modulator 103 as further described herein to minimize or eliminate the design challenges caused by non-linear gain.

Figure 3:
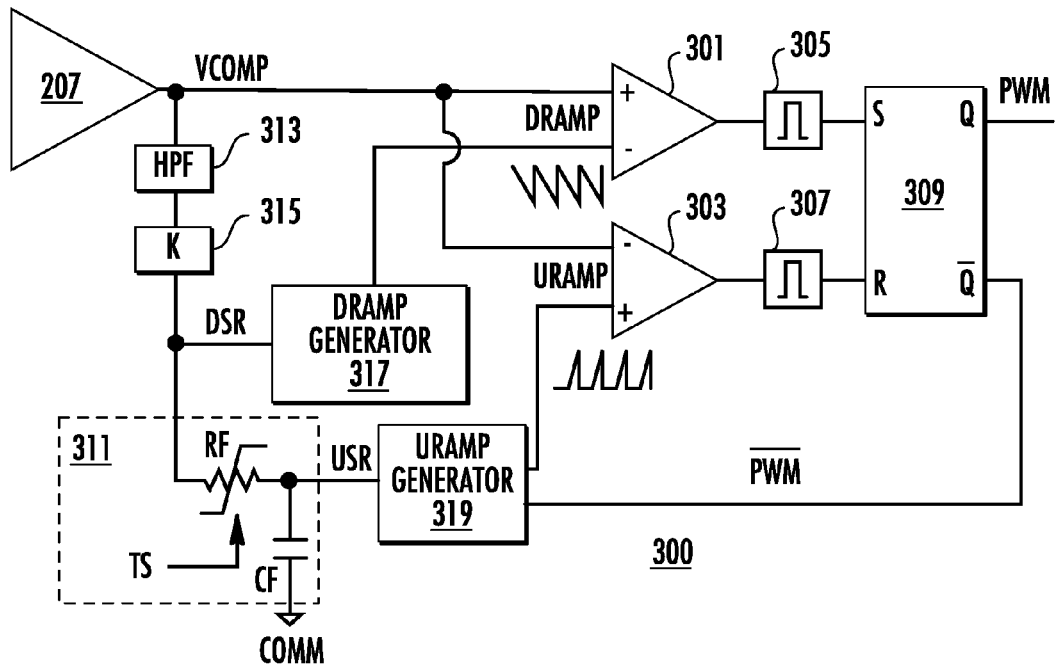
FIG. 3 is a schematic and block diagram of a modulator including a linearity controller implemented according to one embodiment of the present invention, in which the modulator is configured as a variable frequency, dual edge duty cycle controller which may be used as the modulator of FIGS. 1 and 2.

FIG. 3 is a schematic and block diagram of a modulator 300 including a linearity controller 311 implemented according to one embodiment of the present invention, in which the modulator 300 may be used as the modulator 103. In this embodiment, the modulator 300 is configured as a variable frequency, dual edge duty cycle controller. The error amplifier 207 provides VCOMP, which is provided to the positive input of a down ramp comparator 301, which receives a down ramp signal DRAMP at its negative input. The output of the down ramp comparator 301 is provided through a one-shot pulse device 305 to a set input of a set-reset (SR) latch 309. VCOMP is also provided to the negative input of an up ramp comparator 303, which receives an up ramp signal URAMP at its positive input. The output of the up ramp comparator 303 is provided through another one-shot pulse device 307 to a reset input of the SR latch 309. The Q output of the SR latch 309 provides the PWM signal and the inverting Q output $\overline{Q}$ provides an inverted PWM signal $\overline{PWM}$.

$\overline{PWM}$ is fed back to an input of an up ramp generator 319, which provides the URAMP signal at an output. VCOMP is provided through a high pass filter (HPF) to an input of a gain device 315 with gain K, having its output providing a down ramp slew signal DSR provided to a slope adjust input of a down ramp generator 317. The down ramp generator 317 has an output providing the DRAMP signal. DSR is further provided to an input of the linearity controller 311, having an output providing an up ramp slew signal USR to a slope adjust input of the up ramp generator 319.

The linearity controller 311 includes a filter with a resistor RF coupled between DSR and USR and a capacitor CF coupled between USR and COMM. RF is shown as a variable resistor and the filter time constant may be variable in one embodiment. In another embodiment, RF is adjusted or otherwise programmed to set the filter time constant of the RF&CF filter to the desired steady state switching period TS. The TS value is typically readily available on the controller chip.

In general operation of the modulator 300, the DRAMP signal resets high above VCOMP and ramps down. When DRAMP falls to the level of VCOMP, the comparator 301 asserts its output high and the pulse device 305 outputs a pulse to set the SR latch 309 pulling PWM high. When PWM goes high, $\overline{PWM}$ goes low initiating an upward ramp on the URAMP signal. When URAMP rises to the level of VCOMP, the comparator 303 asserts its output high and the pulse device 307 outputs a pulse to reset the SR latch 309 pulling PWM back low.

The DSR signal is used to speed up (transient insertion) or slow down (transient release) the slew rate of the DRAMP signal during transient events. When VCOMP rises in response to a transient insertion event, DSR is adjusted and the down ramp generator 317 increases the slew rate of DRAMP to speed up the response of the modulator 300 to more quickly respond to the transient insertion event. In a conventional modulator, such variable response also changes the modulator gain. The modulator gain (G) in a conventional controller is proportional to the steady state switching period TS divided by the actual switching period TP during operation, or G∝TS/TP. This non-linearity contributes to the regulator design challenges previously described.

The linearity controller 311 responds to changes of DSR and adjusts USR accordingly. DSR is related to or otherwise proportional to the actual switching period TP. USR adjust the slew rate of the URAMP signal in response to DSR and thus in response to the transient events. In particular, the slew rate of URAMP is adjusted to counteract the increase of gain based on changes of the slew rate of DRAMP so that the modulator gain remains constant during steady state and during transient events. This linearity compensates to overcome the design challenges of the conventional variable frequency modulator.

Figure 4:
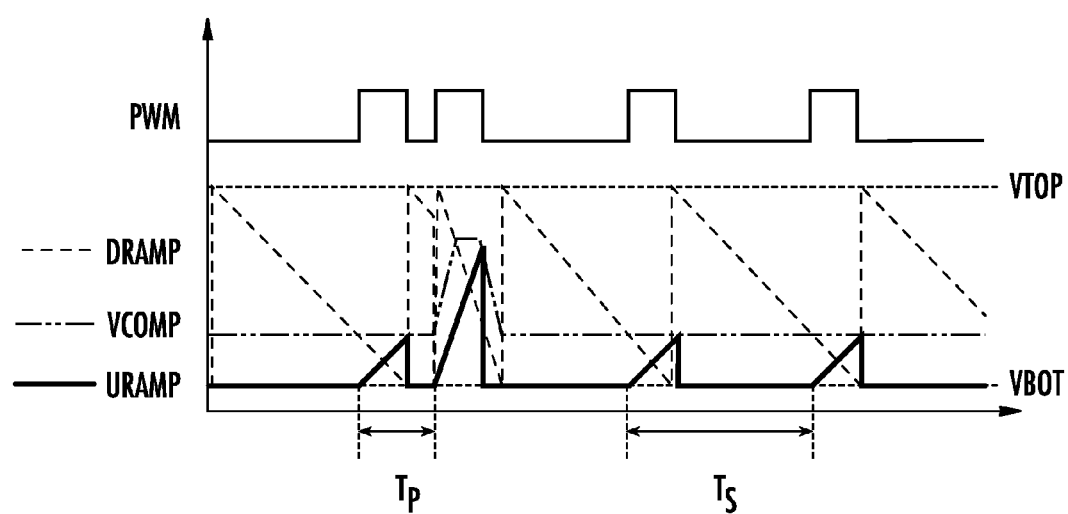
FIG. 4 is a timing diagram plotting signals of the modulator of FIG. 3 illustrating exemplary operation.

FIG. 4 is a timing diagram plotting PWM, DRAMP, VCOMP and URAMP versus time illustrating operation of the modulator 300 including the linearity controller 311. DRAMP ramps down from an upper voltage level VTOP. When DRAMP intersects VCOMP, PWM goes high and URAMP begins ramping up from a lower voltage level VBOT. When URAMP intersects VCOMP, PWM is reset low. When DRAMP discharges to VBOT, it is reset high back to VTOP, and operation repeats in this manner. In response to a transient insertion event, VCOMP increases quickly causing DSR to increase the slew rate of DRAMP, which decreases quickly. DRAMP thus intersects VCOMP much more quickly in the cycle as compared to the steady state condition so that URAMP begins sooner causing PWM to go back high sooner. The actual switching period TP is decreased relative to the steady state switching period TS. The linearity controller 311 senses the increase of DSR and changes USR accordingly to adjust the slew rate of URAMP, so that it rises more quickly to intersect VCOMP more quickly to terminate the pulse of PWM sooner in the cycle. In this manner, the slew rate of URAMP is adjusted in response to the change of slew rate of DRAMP so that the modulator gain remains relatively constant during the transient insertion event. VCOMP settles back down after the transient event and the modulator 300 returns to its steady state switching period TS.

Figure 5:
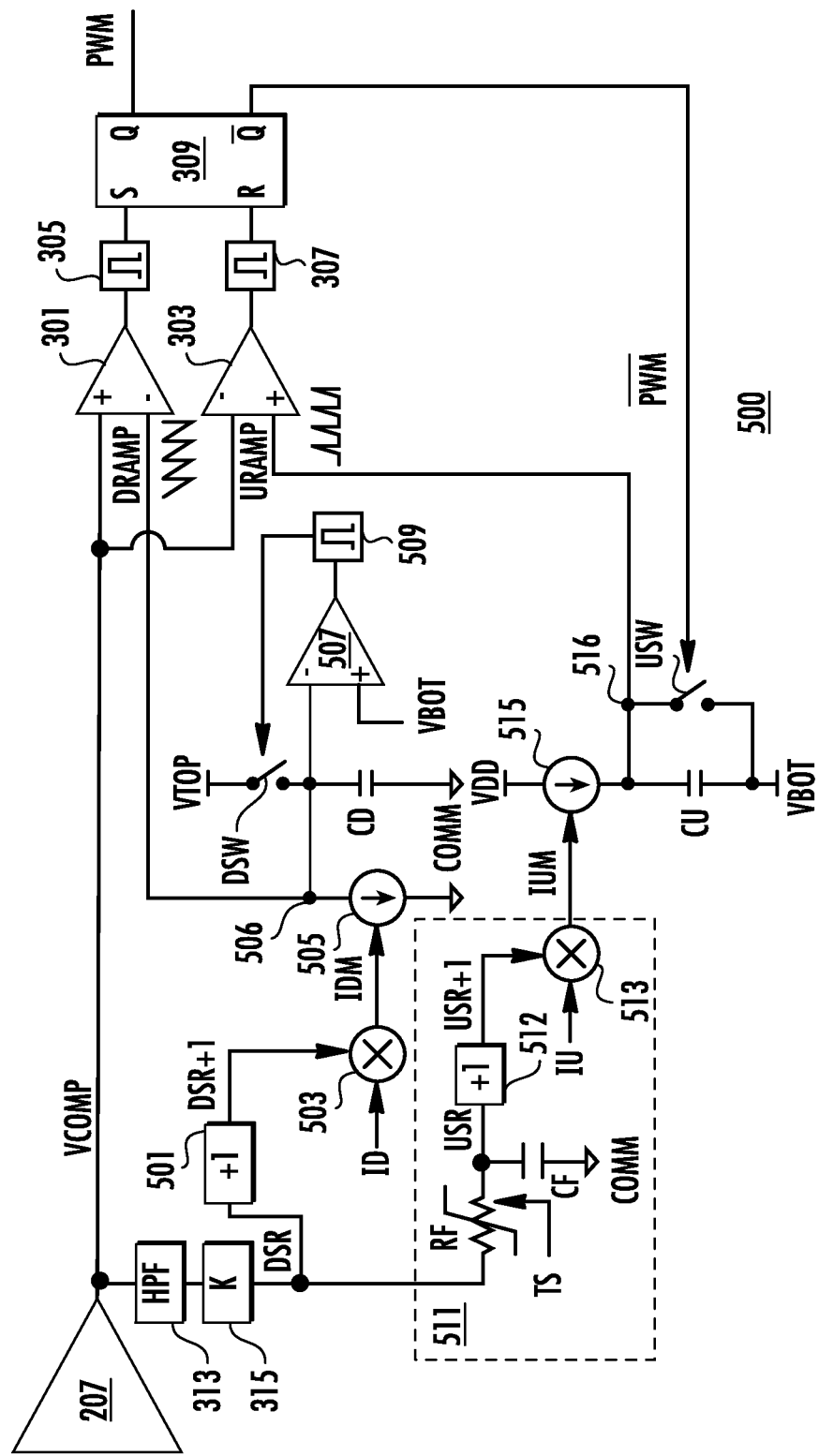
FIG. 5 is a schematic and block diagram of a modulator including the linearity controller of FIG. 3, in which the modulator is configured as a variable frequency, dual edge duty cycle controller which may be used as the modulator of FIGS. 1 and 2.

FIG. 5 is a schematic and block diagram of a modulator 500 including a linearity controller 511 implemented according to one embodiment of the present invention, in which the modulator 500 may be used as the modulator 103. In this embodiment, the modulator 500 is a more detailed variable frequency, dual edge duty cycle controller similar to the modulator 300 in which similar components have the same reference numbers. The error amplifier 207, the comparators 301 and 303, the pulse devices 305 and 307, the SR latch 309, the HPF 313, and the gain device 315 are included and coupled and configured to operate in substantially similar manner. Additional details of the DRAMP generator 317 and the URAMP generator 319 are provided. The linearity controller 511 is similar to the linearity controller 311 but includes additional components for interfacing the up ramp controller.

DSR is provided to an input of a +1 adder 501, which outputs a signal DSR+1 to an input of a multiplier 503. The multiplier 503 receives a down ramp current ID at another input and outputs a modified down ramp current IDM to a control input of a current sink 505. The current sink 505 is coupled between COMM and a down ramp node 506 developing the DRAMP signal. A down ramp capacitor CD is coupled between node 506 and COMM, and node 506 is coupled to the negative input of a comparator 507 receiving VBOT at its positive input. The comparator 507 has its output coupled through a pulse device 509 to a control input of a down ramp switch DSW. DSW is coupled between VTOP and node 506.

The linearity controller 511 includes RF, CF, a +1 adder 512 and a combiner 513. USR is provided to an input of the +1 adder 512, which outputs a signal USR+1 to an input of the multiplier 513. The multiplier 513 receives an up ramp current IU at another input and outputs a modified UP ramp current IUM to a control input of a current source 515 referenced to a source voltage VDD. The current source 515 sources current to an up ramp node 516 developing the URAMP signal. An up ramp capacitor CU is coupled between node 516 and VBOT. $\overline{\text{PWM}}$ is provided to a control input of an up ramp switch USW, which is coupled between node 516 and VBOT.

Operation of the modulator 500 is substantially the same as described for the modulator 300 as illustrated by the timing diagram of FIG. 4. During steady state operation, VCOMP is steady and DSR goes to zero. The +1 adder 501 provides a value of 1 to the multiplier 503, so that ID passes substantially unmodified as IDM to the control input of the current sink 505. The current sink 505 continuously discharges capacitor CD with current IUD (ID during steady state) to develop the DRAMP signal until it falls to VBOT, at which time the comparator 507 asserts its output high so that the pulse device 509 momentarily closes the switch DSW. When DSW is closed, the capacitor CD is quickly charged to VTOP, the output of the comparator 507 goes back low, and the switch DSW is opened. Then DRAMP then ramps down again as capacitor CD is discharged by the current sink 505 and operation repeats in this manner.

During steady state operation, the +1 adder 511 provides a value of 1 to the multiplier 513, so that IU passes substantially unmodified as IUM to the control input of the current source 515. The current source 515 charges capacitor CU with current IUM (IU during steady state) while $\overline{\text{PWM}}$ is low to develop the URAMP signal until it rises to VCOMP. When URAMP reaches VCOMP, the comparator 303 asserts its output high to reset PWM low and assert $\overline{\text{PWM}}$ high. When $\overline{\text{PWM}}$ is asserted high, USW is closed discharging the capacitor CU so that URAMP falls to VBOT. URAMP stays at VBOT until $\overline{\text{PWM}}$ is next asserted low, at which time capacitor CU is charged again to ramp up URAMP. Operation repeats in this manner during steady state.

In response to a load transient, VCOMP increases causing DSR to increase so that DSR+1 increases above 1. IDM is increased above ID increasing the slew rate of DRAMP so that is falls more quickly as previously described with reference to FIG. 4. When DSR is increased, USR is increased by a corresponding amount so that USR+1 rises above 1. IUM is increased above IU increasing the slew rate of URAMP. The slew rate of URAMP is changed by the appropriate amount in response to the change of the slew rate of DRAMP to maintain the gain of the modulator 500 during load transients.

Figure 6:
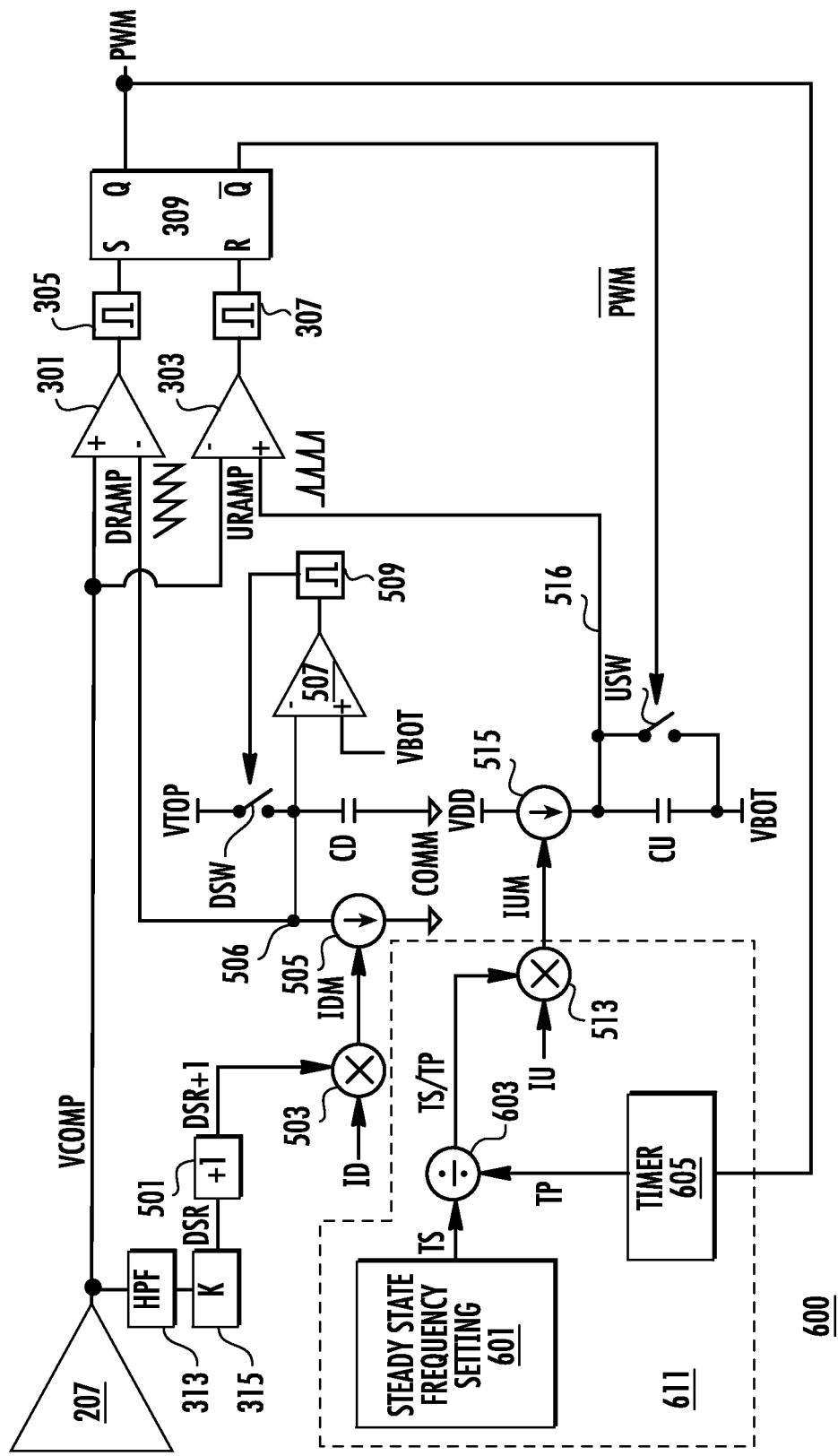
FIG. 6 is a schematic and block diagram of a modulator including a linearity controller implemented according to one embodiment, in which the modulator is configured as a variable frequency, dual edge duty cycle controller which may be used as the modulator of FIGS. 1 and 2.

FIG. 6 is a schematic and block diagram of a modulator 600 including a linearity controller 611 implemented according to one embodiment of the present invention, in which the modulator 600 may be used as the modulator 103. In this embodiment, the modulator 600 is a more detailed variable frequency, dual edge duty cycle controller similar to the modulator 500 in which similar components have the same reference numbers. In this case, substantially all of the components are the same except that the linearity controller 311 and the +1 adder 511 are replaced by linearity controller 611, which includes a steady state frequency setting network 601, a divider 603, the multiplier 513, and a timer 605. The steady state frequency setting network 601 outputs TS to one input of the divider 603, receiving TP at another input and providing TS/TP at one input of the multiplier 513 (replacing input USR+1). Thus, the TS/TP value is used to modify the URAMP slew rate. The timer 605 measures the period of PWM for determining the actual switching period TP (using a ramp or counter or the like), in which TP is provided to the divider 603. TS may be programmed and this value is typically readily available within the controller chip.

Operation of the modulator 600 is substantially similar to that described above for the modulators 300 and 500 as illustrated in FIG. 4. A load insertion transient causes TP to decrease so that the TS/TP value increases to increase the slew rate of URAMP. The slew rate of URAMP is adjusted by the appropriate amount to maintain the gain of the modulator 600 during load transients.

Figure 7:
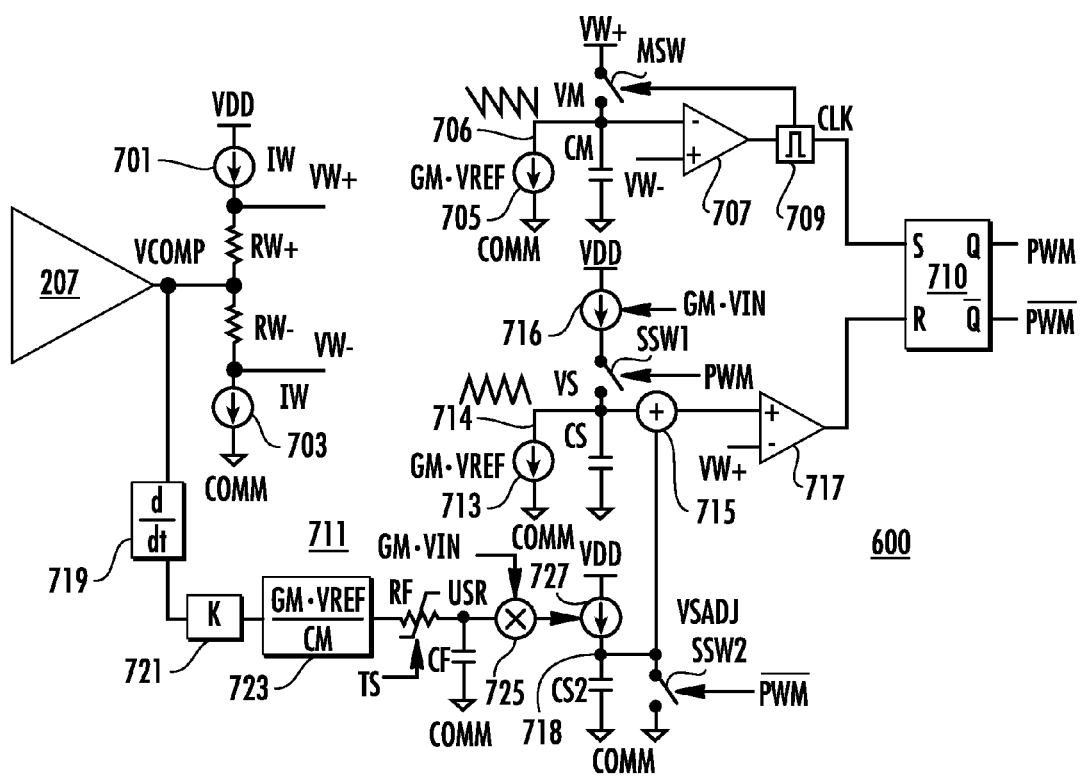
FIG. 7 is a schematic and block diagram of a modulator including a linearity controller implemented according to one embodiment of the present invention, in which the modulator is configured as a variable frequency peak current mode controller which may be used as the modulator of FIGS. 1 and 2.

FIG. 7 is a schematic and block diagram of a modulator 700 including a linearity controller 711 implemented according to one embodiment of the present invention, in which the modulator 700 may be used as the modulator 103. In this embodiment, the modulator 700 is a more detailed variable frequency peak current mode controller. VCOMP is provided to a window network including a current source 701 referenced to VDD and providing a window current IW to one end of a window resistor RW+ developing an upper or positive window voltage VW+. The other end of RW+ is coupled to VCOMP and to one end of another window resistor RW−. The other end of RW− develops a lower or negative window voltage VW− and is coupled to one end of a current sink 703. The other end of current sink 703 is coupled to COMM. In this manner, VW+ remains separated above and VW− remains separated below VCOMP by corresponding window voltages. RW+ and RW− may have the same resistance value for a symmetric window voltage around VCOMP.

A master network includes a current sink 705 sinking a current GM·VREF from a master node 706 developing a master ramp voltage VM. The current sink 705 may be implemented by a transconductance amplifier having in input receiving VREF and having a transconductance gain "GM." A master capacitor CM is coupled between node 706 and COMM and node 706 is coupled to the negative input of a comparator 707 receiving VW− at its positive input. The output of the comparator 707, shown as CLK, is provided through a pulse device 709 to a control input of a switch MSW and to the set input of an SR latch 710. VW+ is provided to one switched terminal of the switch MSW, having its other switched terminal coupled to node 706. In operation, the current sink 705 discharges capacitor CM at a rate proportional to GM·VREF while MSW is opened. When VM falls below the lower window voltage VW−, the comparator 707 asserts its output high so that the SR latch 710 asserts PWM high and the switch MSW is closed to reset VM high to the upper window voltage VW+.

A slave network includes a current sink 713 sinking a current GM·VREF from a slave node 714 developing a slave ramp voltage VS. The current sink 713 may also be implemented by a transconductance amplifier with transconductance gain GM. A slave capacitor CS is coupled between node 714 and COMM and node 714 is coupled to one input of an adder 715, receiving a voltage VSADJ at its other input. The output of the adder 715 is coupled to the positive input of a comparator 717 receiving VW+ at its negative input. The output of the comparator 717 is provided to the reset input of SR latch 710. A current source 716 referenced to VDD sources a current GM·VIN to one switched terminal of a switch SSW1, having its other switched terminal coupled to node 714. The current source 716 may also be implemented as a transconductance amplifier with transconductance gain GM. PWM is provided to the control input of the switch SSW1.

In operation of the slave network during steady state, VSADJ is low or zero and the current sink 713 discharges capacitor CS at a rate proportional to GM·VREF while SSW1 is opened. When PWM is asserted high, the switch SSW1 is closed so that the current source 716 sources a current proportional to GM·VIN to node 714 to charge the capacitor CS. It is noted that VREF is indicative of the voltage level of the output voltage VOUT and VIN is greater than VOUT, so that the voltage VS ramps up proportional to a rate GM·(VIN−VREF) while switch SSW1 is closed. When VS (or the output of the adder 715) rises above VW+, the comparator 717 asserts its output high to reset the SR latch 710 and pull PWM back low.

The linearity controller 711 includes a slew detector 719 having an input receiving VCOMP and an output provided to a gain device 721 with gain K, having its output provided to another gain block 723 with gain (GM·VREF)/CM in which "CM" is the capacitance of the master capacitor CM. The output of the gain block 723 is provided to the RF&CF filter configured in substantially similar manner as previously described for developing USR provided to one input of a multiplier 725. A value GM·VIN is provided to another input of the multiplier 725, having its output provided to the control input of a current source 727 referenced to VDD. The current source 727 sources current into a node 718 developing the VSADJ voltage. A capacitor CS2 is coupled between node 718 and COMM. A switch SSW2 has switched terminals coupled between node 718 and COMM and has a control input receiving $\overline{PWM}$. VSADJ is provided to an input of the adder 715 as previously described.

In operation of the linearity controller 711, during steady state when VCOMP is not changing, the output of slew detector 719 is zero or near zero so that VSADJ also goes to zero. When VCOMP changes in response to a load transient, VW+ and VW− move up or down in unison with VCOMP, which changes the frequency of operation since VM on node 706 toggles between these two voltage levels. For example, when VCOMP increases, VM falls to the VW− more quickly (compared to steady state) and resets back to VW+, so that overall frequency is increased. Likewise, when VCOMP decreases, VM takes longer to reach VW− so that the frequency decreases. The slew detector 719 detects the rate of change of VCOMP and blocks 719, 721 and 723 and the RF&CF filter develop the USR signal. USR is multiplied by GM·VIN to control the current level of the current source 727 to charge the capacitor CS2 while $\overline{PWM}$ is low and switch SSW2 is opened. When PWM goes low and $\overline{PWM}$ goes high, switch SSW2 is closed and the capacitor CS2 is discharged and VSADJ goes to zero. The VSADJ voltage is added to VS to maintain the gain of the modulator 700 at a relatively constant level. In this case, since the actual switching frequency is proportional to the slew rate of VCOMP, VCOMP may be used to derive the signal VSADJ to modify the modulator ramp signal to linearize modulator gain.

It is noted that during transient events without VSADJ, the VS signal, which represents regulator inductor current, tracks above the average current. In this conventional case, the duty cycle is too large since the gain increases with increases in clock frequency. When VSADJ is developed and applied as shown, the VS signal more accurately tracks the average current as the linearity controller 711 corrects the modulator gain as frequency increases or decreases.

It has been determined that the AC response (phase margin and gain) of a conventional variable frequency regulator is non-linear in which the gain is proportional to TS/TP. Thus, as the frequency increases or decreases, the gain increases or decreases by a proportional amount. As previously described, such non-linear modulator gain can contribute to large overshoots, inconsistent dynamic response from small load to large load steps, inconsistent dynamic response during high frequency repetitive load transients, non-linear AC (alternating current) response, etc. The AC response of substantially the same variable frequency regulator modified to include a linearity controller as described herein allows the gain and phase margin to remain substantially unmodified with switching frequency vastly improving AC response and eliminating or otherwise minimizing the design challenges previously described.

A modulator with a linearity controller increases a control ramp slew rate based on the switching period which results in a large reduction in ringback. The response from small to large load steps is much more consistent as compared to conventional configurations. The modulator gain remains flat during variable frequency operation. A linearity controller may be applied to other variable frequency topologies, such as peak current mode control, hysteretic control, synthetic ripple regulators, etc.

Although the present invention has been described in considerable detail with reference to certain preferred versions thereof, other versions and variations are possible and contemplated. Those skilled in the art should appreciate that they can readily use the disclosed conception and specific embodiments as a basis for designing or modifying other structures for carrying out the same purposes of the present invention without departing from the spirit and scope of the invention as defined by the following claim(s).

The invention claimed is:

1. A variable frequency modulator, comprising:
   a compensation network which is configured to provide a compensation signal indicative of an output load condition;
   a first pulse control network which is configured to initiate pulses on a pulse control signal, wherein said first pulse control network is configured to adjust operating frequency based on changes of said compensation signal;
   a second pulse control network which is configured to terminate said pulses on said pulse control signal based on a predetermined timing parameter; and
   a linearity controller, coupled to said second pulse control network, which is configured to adjust timing of terminating said pulses by said second pulse network based on a predetermined steady state operating frequency and an actual operating frequency to maintain modulator gain at a constant level.

2. The variable frequency modulator of claim 1, further comprising:
   a slew detection network which is configured to sense changes of said compensation signal and to provide a slew rate signal indicative thereof; and
   wherein said linearity controller comprises a filter network configured according to said steady state operating frequency, wherein said filter network receives said slew rate signal and provides a timing adjust signal indicative thereof and wherein said timing adjust signal is used to adjust said predetermined timing parameter to adjust timing of terminating said pulses.

3. The variable frequency modulator of claim 2, wherein said slew rate detection network comprises a high pass filter.

4. The variable frequency modulator of claim 2, wherein said filter network comprises a resistor-capacitor filter which is configured based on a steady state operating period.

5. The variable frequency modulator of claim 1, wherein said linearity controller comprises:
   a steady state frequency setting module which provides a steady state period value;
   a timer network which receives said pulse control signal and which provides an actual operating period value;
   a first combiner which is configured to combine said steady state period value and said actual operating period value to provide an adjust value; and
   a second combiner which is configured to combine said adjust value with a predetermined timing value provided by said second pulse control network.

6. The variable frequency modulator of claim 1, wherein said linearity controller comprises:
   a slew detection network which is configured to sense changes of said compensation signal and to provide a slew rate signal indicative thereof;
   at least one gain block which is configured to adjust a gain of said slew rate signal; and
   a filter network configured according to said steady state operating frequency, wherein said filter network receives said slew rate signal and provides a timing adjust signal indicative thereof that is used to adjust said predetermined timing parameter to adjust timing of terminating said pulses.

7. The variable frequency modulator of claim 1, wherein:
   said first pulse control network is configured to generate a first ramp signal and to initiate a pulse on said pulse control signal when said first ramp signal intersects said compensation signal, wherein said first pulse control network is configured to adjust a slew rate of said first ramp signal based on changes of said compensation signal;
   wherein said second pulse control network is configured to generate a second ramp signal upon initiation of said pulse of said pulse control signal and to terminate said pulse when said second ramp signal intersects said compensation signal; and
   wherein said linearity controller is configured to adjust a slew rate of said second ramp signal based on said predetermined steady state operating frequency and said actual operating frequency to maintain said modulator gain at said constant level.

8. The variable frequency modulator of claim 1, wherein:
   said first pulse control network comprises:
      a window network which is configured to develop an upper window level at a fixed amount above said compensation signal and a lower window level at a fixed amount below said compensation signal; and
      a ramp generator which is configured to generate a first ramp signal which ramps between said upper and lower window signals;
   wherein said second pulse control network is configured to generate a second ramp signal which ramps up to said upper window level during a pulse of said pulse control signal at a rate based on an input voltage and a reference voltage and which ramps down between pulses of said pulse control signal at a rate based on said reference voltage; and
   wherein said linearity controller is configured to adjust a slew rate of said second ramp signal when ramping down based on said predetermined steady state operating frequency and said actual operating frequency to maintain said modulator gain at said constant level.

9. A method of operating a variable frequency modulator, comprising:
   providing a compensation signal indicative of an output load condition;
   initiating pulses on a pulse control signal at an operating frequency based on changes of the compensation signal;
   terminating the pulses on the pulse control signal based on a predetermined timing parameter; and
   adjusting timing of terminating the pulses based on a predetermined steady state operating frequency and an actual operating frequency to maintain modulation gain at a constant level.

10. The method of claim 9, further comprising:
   sensing changes of the compensation signal and providing a slew rate signal indicative thereof;
   filtering the slew rate signal based on a steady state period and providing a timing adjust signal indicative thereof; and
   wherein said adjusting timing comprises using the timing adjust signal to adjust a timing signal based on the predetermined timing parameter.

11. The method of claim 10, wherein said filtering comprises high pass filtering.

12. The method of claim 10, wherein said filtering comprises filtering using a resistor-capacitor filter which is configured based on the steady state period.

13. The method of claim 9, wherein said adjusting timing comprises:
   providing a steady state period value;
   measuring timing of the pulse control signal and providing an actual operating period value;

combining the steady state period value with the actual operating period value and providing a corresponding adjust value; and using the adjust value to adjust the predetermined timing parameter to adjust timing of said terminating the pulses.

14. The method of claim 9, wherein said adjusting timing comprises:

sensing changes of the compensation signal and providing a slew rate signal indicative thereof;

adjusting a gain of the slew rate signal;

filtering the slew rate signal based on a steady state period and providing a timing adjust signal indicative thereof; and using the timing adjust signal to adjust the predetermined timing parameter to adjust timing of said terminating the pulses.

15. The method of claim 9, wherein:

said initiating pulses on a pulse control signal comprises generating a first ramp signal and initiating a pulse on the pulse control signal when the first ramp signal intersects the compensation signal;

adjusting a slew rate of the first ramp signal based on changes of the compensation signal;

wherein said terminating the pulses on the pulse control signal comprises generating a second ramp signal upon initiating of the pulse on the pulse control signal and terminating the pulse when the second ramp signal intersects the compensation signal; and wherein said adjusting timing of terminating the pulses comprises adjusting a slew rate of the second ramp signal based on the predetermined steady state operating frequency and the actual operating frequency to maintain modulation gain at a constant level.

16. The method of claim 9, wherein:

said initiating pulses on a pulse control signal comprises developing a window range on either side of the compensation signal and generating a first ramp signal which ramps within the window range;

wherein said terminating the pulses on the pulse control signal comprises generating a second ramp signal which ramps in one direction to a boundary of the window range during a pulse of the pulse control signal at a rate based on a difference between an input voltage and a reference voltage, and which ramps in an opposite direction at a rate based on the reference voltage; and wherein said adjusting timing of terminating the pulses comprises adjusting a slew rate of the second ramp signal when ramping in the opposite direction based on the predetermined steady state operating frequency and the actual operating frequency to maintain modulation gain at a constant level.

17. An electronic device, comprising:

a switching circuit responsive to a pulse control signal for switching voltage applied to an output inductor to convert an input voltage to a regulated output voltage; and a variable frequency modulator, comprising:

a compensation network which is configured to provide a compensation signal indicative of an output load condition;

a first pulse control network which is configured to initiate pulses on said pulse control signal, wherein said first modulation pulse control network is configured to adjust operating frequency based on changes of said compensation signal;

a second pulse control network which is configured to terminate said pulses on said pulse control signal based on a predetermined timing parameter; and a linearity controller, coupled to said second pulse control network, which is configured to adjust timing of terminating said pulses by said second pulse network based on a predetermined steady state operating frequency and an actual operating frequency to maintain modulator gain at a constant level.

18. The electronic device of claim 17, further comprising a processor and a memory both receiving power via said output voltage.

19. The electronic device of claim 17, wherein said variable frequency modulator further comprises:

a slew detection network which is configured to sense changes of said compensation signal and to provide a slew rate signal indicative thereof; and wherein said linearity controller comprises a filter network configured according to said steady state operating frequency, wherein said filter network receives said slew rate signal and provides a timing adjust signal indicative thereof and wherein said timing adjust signal is used to adjust said predetermined timing parameter to adjust timing of terminating said pulses.

20. The electronic device of claim 17, wherein said linearity controller comprises:

a steady state frequency setting module which provides a steady state period value;

a timer which receives said pulse control signal and which provides an actual operating period value; and a combiner which is configured to combine said steady state period value and said actual operating period value to provide an adjust value which is used to adjust said predetermined timing parameter to adjust timing of terminating said pulses.

* * * * *